(12) United States Patent
Liang et al.

(10) Patent No.: US 8,939,475 B2
(45) Date of Patent: Jan. 27, 2015

(54) TWO-WAY LOCK MECHANISM AND RELATED ELECTRONIC DEVICE

(71) Applicant: Wistron Corporation, New Taipei (TW)

(72) Inventors: Jyun-Shuo Liang, New Taipei (TW); Hung-Li Chen, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 57 days.

(21) Appl. No.: 13/886,255

(22) Filed: May 2, 2013

(65) Prior Publication Data

US 2014/0077675 A1     Mar. 20, 2014

(30) Foreign Application Priority Data

Sep. 17, 2012   (TW) .............................. 101134059 A

(51) Int. Cl.
| | |
|---|---|
| *E05C 1/06* | (2006.01) |
| *H05K 5/02* | (2006.01) |
| *G06F 1/16* | (2006.01) |
| *E05C 1/00* | (2006.01) |

(52) U.S. Cl.
CPC ............ *H05K 5/0221* (2013.01); *G06F 1/1679* (2013.01)
USPC .............. 292/142; 292/39; 292/116; 292/279

(58) Field of Classification Search
CPC ...... E05C 1/06; E05C 9/021; E05B 2047/002
USPC ............. 292/22, 32, 33, 39, 51, 95, 112, 116, 292/117, 121, 122, 137, 138, 142, 160, 163, 292/172, 199, 279, 280; 361/679.57, 361/679.58
See application file for complete search history.

(56) References Cited

U.S. PATENT DOCUMENTS

| | | | | |
|---|---|---|---|---|
| 813,455 | A * | 2/1906 | Scheel | 49/178 |
| 1,251,467 | A * | 1/1918 | Blixt | 109/61 |
| 1,545,962 | A * | 7/1925 | Klein | 70/118 |
| 2,431,105 | A * | 11/1947 | Brinson | 292/172 |
| 2,672,745 | A * | 3/1954 | Marchetti | 70/101 |
| 3,756,642 | A * | 9/1973 | Fulton | 292/341.15 |
| 3,806,171 | A * | 4/1974 | Fernandez | 292/39 |
| 4,384,465 | A * | 5/1983 | Muus | 70/129 |
| 4,616,864 | A * | 10/1986 | Douglas | 292/336.3 |
| 5,094,483 | A * | 3/1992 | James | 292/39 |

(Continued)

FOREIGN PATENT DOCUMENTS

| | | | | |
|---|---|---|---|---|
| DE | 1559721 | * | 9/1969 | |
| FR | 1253959 | * | 2/1961 | |
| GB | 2168748 | A * | 6/1986 | ................ E05C 3/34 |

*Primary Examiner* — Carlos Lugo
(74) *Attorney, Agent, or Firm* — Winston Hsu; Scott Margo

(57) ABSTRACT

A two-way lock mechanism includes a gear, a first sub-gear, a second sub-gear, a third sub-gear, a fourth sub-gear, a first hook, a second hook and an actuator. The actuator moves a first distance along a first direction to simultaneously rotate the gear, so as to respectively rotate the second sub-gear and the third sub-gear relative to racks on the first hook and the second hook, and to separate the first hook and the second hook from corresponding fixing portions. The actuator further moves a second distance along a second direction opposite to the first direction for simultaneously rotating the gear, so as to respectively rotate the first sub-gear and the fourth sub-gear relative to the racks on the first hook and the second hook, and to separate the first hook and the second hook from the corresponding fixing portions.

20 Claims, 5 Drawing Sheets

(56) References Cited

U.S. PATENT DOCUMENTS

| | | | |
|---|---|---|---|
| 5,404,737 A * | 4/1995 | Hotzl | 70/279.1 |
| 6,256,194 B1 * | 7/2001 | Choi et al. | 361/679.58 |
| 7,025,394 B1 * | 4/2006 | Hunt | 292/39 |
| 7,256,987 B2 * | 8/2007 | Weng | 361/679.55 |
| 7,451,628 B1 * | 11/2008 | Kim | 70/159 |
| 7,856,856 B2 * | 12/2010 | Shvartz | 70/107 |

\* cited by examiner

TWO-WAY LOCK MECHANISM AND RELATED ELECTRONIC DEVICE

BACKGROUND OF THE INVENTION

1. Field of the Invention

The present invention relates to a lock mechanism and a related electronic device, and more particularly, to a two-way lock mechanism and a related electronic device.

2. Description of the Prior Art

A conventional notebook computer includes an upper casing and a low casing connected to each other in a foldable manner. The upper casing includes a panel module, and the low casing includes a host module and a keyboard module. The upper casing covers the low casing when the notebook computer is not in use. The upper casing pivots relative to the low casing for adjusting a view angle of the panel module according to operation of the notebook computer. As the upper casing covers the low casing, the notebook computer utilizes a lock mechanism to constrain a movement of the upper casing relative to the low casing, to prevent the casings from separation by accident hit. However, constraint of the conventional lock mechanism is released by moving a button along single direction, and the conventional lock mechanism is not suitable for the user with different habits, such as the right-handed user and the left-handed user. Therefore, design of a two-way lock mechanism is an important issue in the mechanical industry.

SUMMARY OF THE INVENTION

The present invention provides a two-way lock mechanism and a related electronic device for solving above drawbacks.

According to the claimed invention, a two-way lock mechanism includes a gear, a first sub-gear, a second sub-gear, a third sub-gear, a fourth sub-gear, a first hook, a second hook and an actuator. The first sub-gear is engaged with the gear. The second sub-gear is for being engaged with the first sub-gear, and the second sub-gear is rotated by the first sub-gear. The third sub-gear is engaged with the gear. The fourth sub-gear is for being engaged with the third sub-gear, and the fourth sub-gear is rotated by the third sub-gear. The first hook buckles a fixing portion. The first hook includes a first rack disposed by sides of the first sub-gear and the second sub-gear. The second hook buckles another fixing portion. The second hook includes a second rack disposed by sides of the third sub-gear and the fourth sub-gear. The actuator is disposed by the gear. The actuator moves a first distance along a first direction to simultaneously rotate the gear, so as to respectively rotate the second sub-gear and the third sub-gear relative to the first rack and the second rack, and to separate the first hook and the second hook from the fixing portions. The actuator further moves a second distance along a second direction opposite to the first direction to simultaneously rotate the gear, so as to respectively rotate the first sub-gear and the fourth sub-gear relative to the first rack and the second rack, and to separate the first hook and the second hook from the fixing portions. The first sub-gear and the second sub-gear are not simultaneously engaged with the first rack, the third sub-gear and the fourth sub-gear are not simultaneously engaged with the second rack when the gear is located at an initial position.

According to the claimed invention, the first sub-gear is engaged with the gear and the second sub-gear and is not engaged with the first rack, the second sub-gear is engaged with the first rack, the third sub-gear is engaged with the gear and the second rack and is selectively engaged with the fourth sub-gear, and the fourth sub-gear is not engaged with the second rack when the actuator moves along the first direction.

According to the claimed invention, the first sub-gear is engaged with the gear and the first rack and is selectively engaged with the second sub-gear, the second sub-gear is not engaged with the first rack, the third sub-gear is engaged with the gear and the fourth sub-gear and is not engaged with the second rack, and the fourth sub-gear is engaged with the second rack when the actuator moves along the second direction.

According to the claimed invention, the two-way lock mechanism further includes at least one resilient component disposed on a side of the actuator. The resilient component drives the actuator back to the initial position.

According to the claimed invention, a first area of the first sub-gear, a second area of the second sub-gear, a third area of the third sub-gear, and a fourth area of the fourth sub-gear do not have rack structure. Areas of the sub-gears face the first rack and the second rack when the gear is located at the initial position.

According to the claimed invention, arc lengths of the first area and the fourth length respectively correspond to the first distance, and arc lengths of the second area and the third area respectively correspond to the second distance.

According to the claimed invention, the first area faces a gap between the second sub-gear and the first rack when the first sub-gear is located at the initial position.

According to the claimed invention, the second area faces the first rack when the second sub-gear is located at the initial position.

According to the claimed invention, the third area faces a gap between the fourth sub-gear and the second rack when the third sub-gear is located at the initial position.

According to the claimed invention, the fourth area faces the second rack when the fourth sub-gear is located at the initial position.

According to the claimed invention, an electronic device includes a first casing, a second casing and a two-way lock mechanism. The first casing includes at least two fixing portions. The second casing is disposed on the first casing in a foldable manner. The two-way lock mechanism is disposed between the first casing and the second casing, so as to lock on the fixing portions for constraint of the first casing and the second casing. The two-way lock mechanism includes a gear, a first sub-gear, a second sub-gear, a third sub-gear, a fourth sub-gear, a first hook, a second hook and a actuator. The first sub-gear is engaged with the gear. The second sub-gear is for being engaged with the first sub-gear, and the second sub-gear is rotated by the first sub-gear. The third sub-gear is engaged with the gear. The fourth sub-gear is for being engaged with the third sub-gear, and the fourth sub-gear is rotated by the third sub-gear. The first hook buckles a fixing portion. The first hook includes a first rack disposed by sides of the first sub-gear and the second sub-gear. The second hook buckles another fixing portion. The second hook includes a second rack disposed by sides of the third sub-gear and the fourth sub-gear. The actuator is disposed by the gear. The actuator moves a first distance along a first direction to simultaneously rotate the gear, so as to respectively rotate the second sub-gear and the third sub-gear relative to the first rack and the second rack, and to separate the first hook and the second hook from the fixing portions. The actuator further moves a second distance along a second direction opposite to the first direction to simultaneously rotate the gear, so as to respectively rotate the first sub-gear and the fourth sub-gear relative to the first rack and the second rack, and to separate the first hook and the second hook from the fixing portions. The first sub-gear and the second sub-gear are not simultaneously engaged with the first rack, the third sub-gear and the fourth sub-gear are not simultaneously engaged with the second rack when the gear is located at an initial position.

The two-way lock mechanism of the present invention utilizes a structural combination of the normal gear and the local gears to simultaneously separate the first hook and the second hook from the fixing portions when the actuator moves to the left or to the right. The two-way lock mechanism of the present invention suitable for the right-handed habit and the left-handed habit has advantages of simple structure and low manufacturing cost, and can effectively increase operational convenience and market competition of the product.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
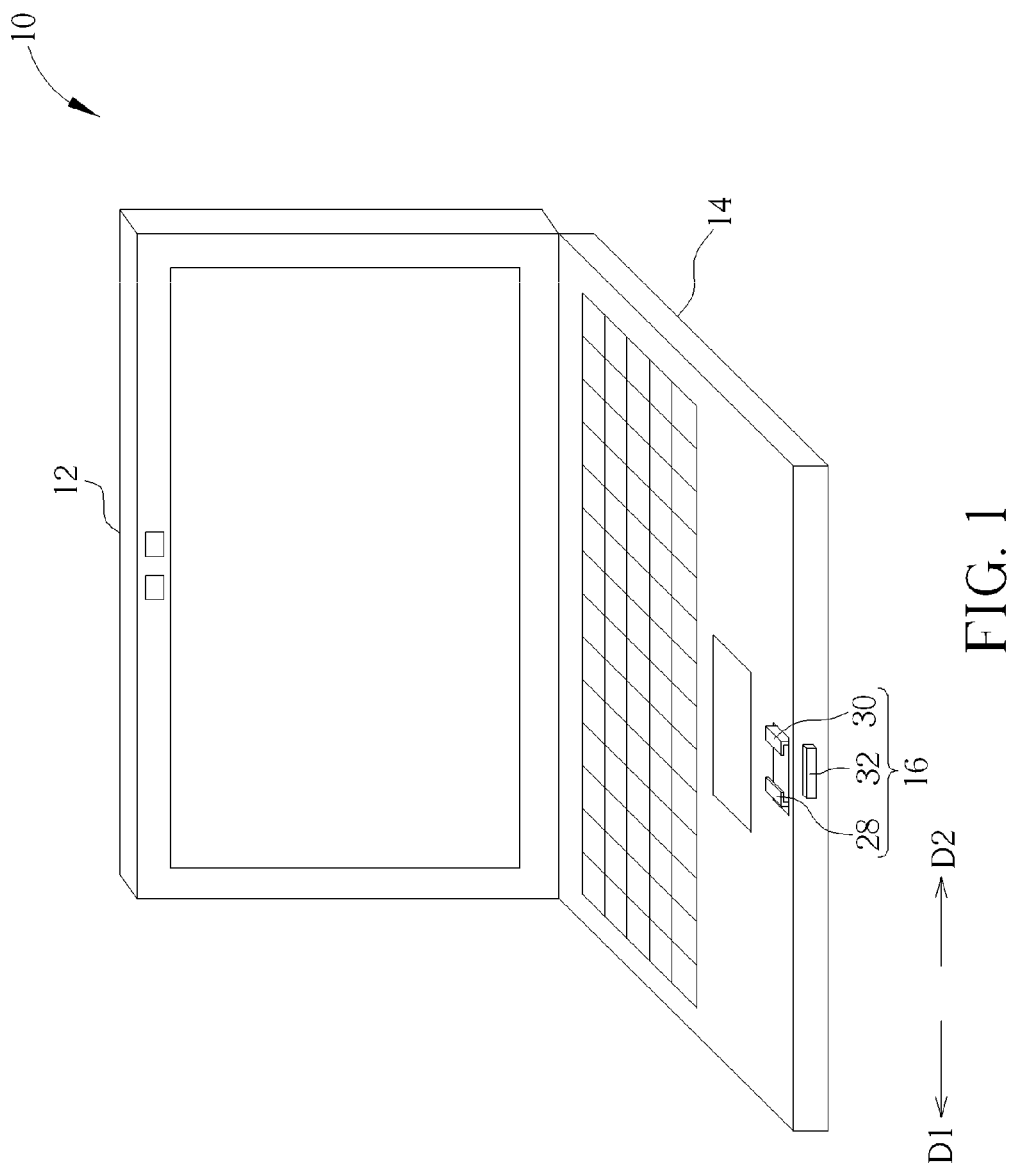
FIG. 1 is a diagram of an electronic device according to an embodiment of the present invention.

Please refer to FIG. 1. FIG. 1 is a diagram of an electronic device 10 according to an embodiment of the present invention. The electronic device 10 includes a first casing 12, a second casing 14 and a two-way lock mechanism 16. The first casing 12 is disposed on the second casing 14 in a foldable manner. The two-way lock mechanism 16 is disposed between the first casing 12 and the second casing 14. The two-way lock mechanism 16 can buckle the casings when the electronic device 10 is closed, so as to constrain a relative movement between the first casing 12 and the second casing 14. For example, the electronic device 10 can be a notebook computer, the first casing 12 can be a display, and the second casing 14 can be a host. The two-way lock mechanism 16 can be driven along a first direction D1 and a second direction D2 to release the constraint of the first casing 12. The first direction D1 can be substantially opposite to the second direction D2.

Figure 2:
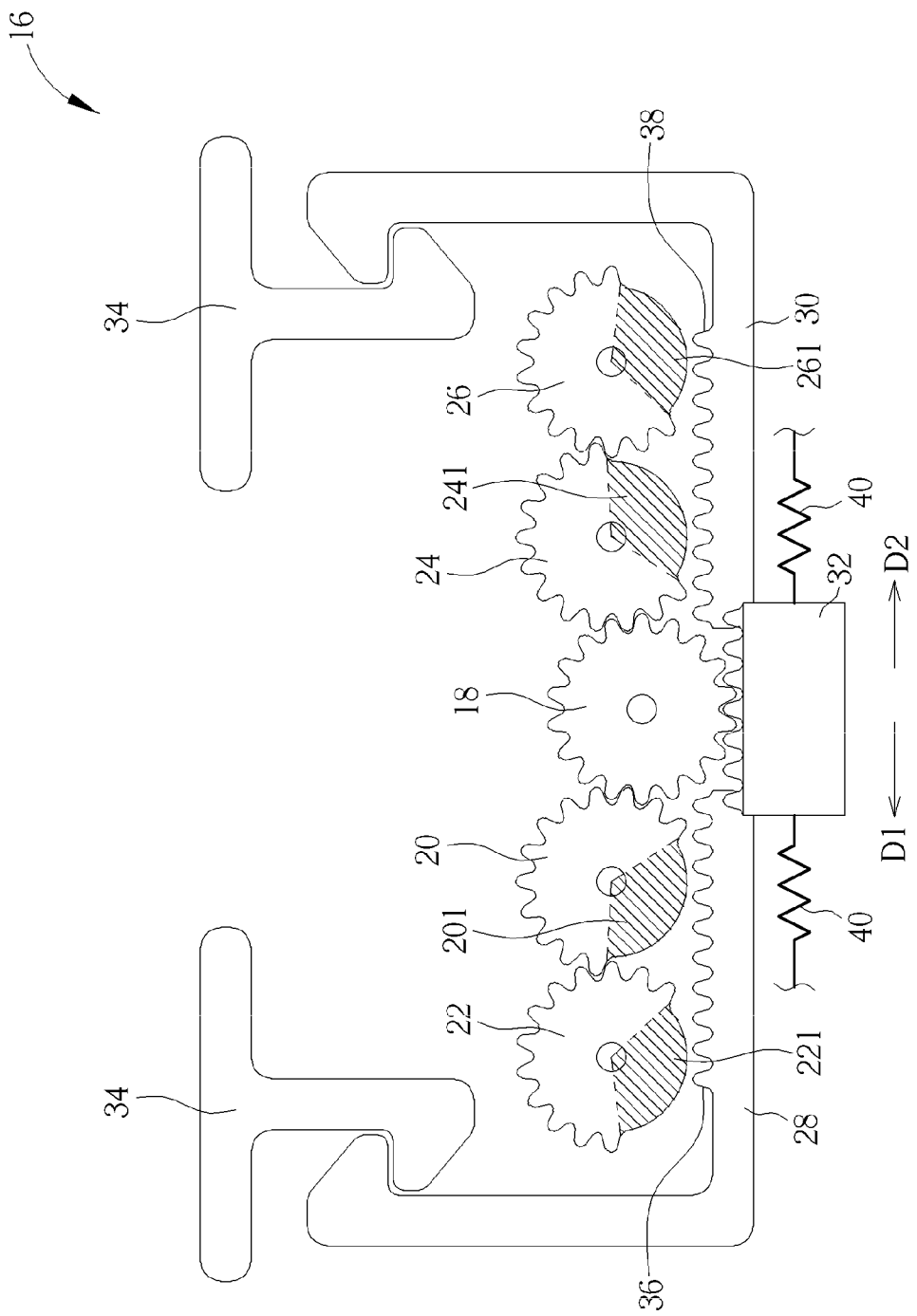
FIG. 2 is a diagram of a two-way lock mechanism according to the embodiment of the present invention.

Please refer to FIG. 2. FIG. 2 is a diagram of the two-way lock mechanism 16 according to the embodiment of the present invention. The two-way lock mechanism 16 includes a gear 18, a first sub-gear 20, a second sub-gear 22, a third sub-gear 24, a fourth sub-gear 26, a first hook 28, a second hook 30 and an actuator 32. The gear 18 is disposed on the center, and the sub-gears are disposed by sides of the gear 18. The gear 18 is a normal gear, and the sub-gears are local gears. Part of the sub-gear is smooth without rack structure, so that the sub-gear is not engaged with the adjacent sub-gear and the rack during a predetermined range. An amount of the sub-gears is not limited to the above-mentioned embodiment, and depends on design demand. The two-way lock mechanism 16 of the present invention can be used to release the constraint by driving the actuator 32 at two opposite directions, such as the first direction D1 and the second direction D2.

The first hook 28 and the second hook 30 respectively buckle the corresponding fixing portions 34. The fixing portions 34 are disposed on the first casing 12, the first hook 28 and the second hook 30 are disposed on the second casing 14, and the electronic device 10 constrains the relative movement of the casings via a combination of the hooks and the fixing portions. The first hook 28 includes a first rack 36 disposed by sides of the first sub-gear 20 and the second sub-gear 22. The second hook 30 includes a second rack 38 disposed by sides of the third sub-gear 24 and the fourth sub-gear 26. The actuator 32 is disposed by the gear 18 and is accurately engaged with the gear 18. The first hook 28 and the second hook 30 can simultaneously separate from the fixing portions 34 when the actuator 32 moves a first distance L1 (not shown in FIG. 2) along the first direction D1 or moves a second distance L2 (not shown in FIG. 2) along the second direction D2, so as to release the constraint of the two-way lock mechanism 16. The actuator 32 is driven to rotate the gear 18 and the sub-gears. The first distance L1 and the second distance L2 are substantially greater than engagements of the first hook 28 and the second hook 30 relative to the corresponding fixing portions 34.

In addition, the two-way lock mechanism 16 can further include at least one resilient component 40 disposed on a side of the actuator 32. As the actuator 32 moves, the first hook 28 and the second hook 30 separate from the fixing portions 34, meanwhile the resilient component 40 can be stretched (or be compressed) to store a resilient recovering force. As the external force applied to the actuator 32 is removed, the resilient recovering force of the resilient component 40 can drive the actuator 32 back to an initial position, so that the first hook 28 and the second hook 30 can respectively buckle the corresponding fixing portions 34. Generally, the two-way lock mechanism 16 can further include two resilient components 40 respectively disposed on a left side and a right side of the actuator 32. The resilient components 40 can provide stable resilient recovering force when the actuator 32 moves along the first direction D1 or the second direction D2.

As shown in FIG. 2, the two-way lock mechanism 16 is located at the initial position. The first sub-gear 20 and the third sub-gear 24 are respectively disposed on the left side and the right side of the gear 18. The second sub-gear 22 is disposed on a side of the first sub-gear 20 relative to the gear 18, and the fourth sub-gear 26 is disposed on a side of the third sub-gear 24 relative to the gear 18. When the two-way lock mechanism 16 is located at the initial position, the first sub-gear 20 is engaged with the gear 18, selectively engaged with the second sub-gear 22, and not engaged with the first rack 36; the second sub-gear 22 is selectively engaged with the first sub-gear 20, and not engaged with the first rack 36; the third sub-gear 24 is engaged with the gear 18, selectively engaged with the fourth sub-gear 26, and not engaged with the second rack 38; the fourth sub-gear 26 is selectively engaged with the third sub-gear 24, and not engaged with the second rack 38. Therefore, each sub-gear can be partially engaged with the adjacent element (the gear or the sub-gear), and further can drive the rack or not drive the rack according to the moving direction of the actuator 32, so as to achieve function of the two-way lock mechanism 16.

It is to say, a first area 201 of the first sub-gear 20, a second area 221 of the second sub-gear 22, a third area 241 of the third sub-gear 24, and a fourth area 261 of the fourth sub-gear 26 do not have rack structure. The slash symbol shown in FIG. 2 represents the above-mentioned areas. Each sub-gear face itself area toward the first rack 36 and the second rack 38. For example, the first sub-gear 20 and the second sub-gear 22 are not simultaneously engaged with the first rack 36, the third sub-gear 24 and the fourth sub-gear 26 are not simultaneously engaged with the second rack 38 when the two-way lock mechanism 16 is located at the initial position.

Figure 3:
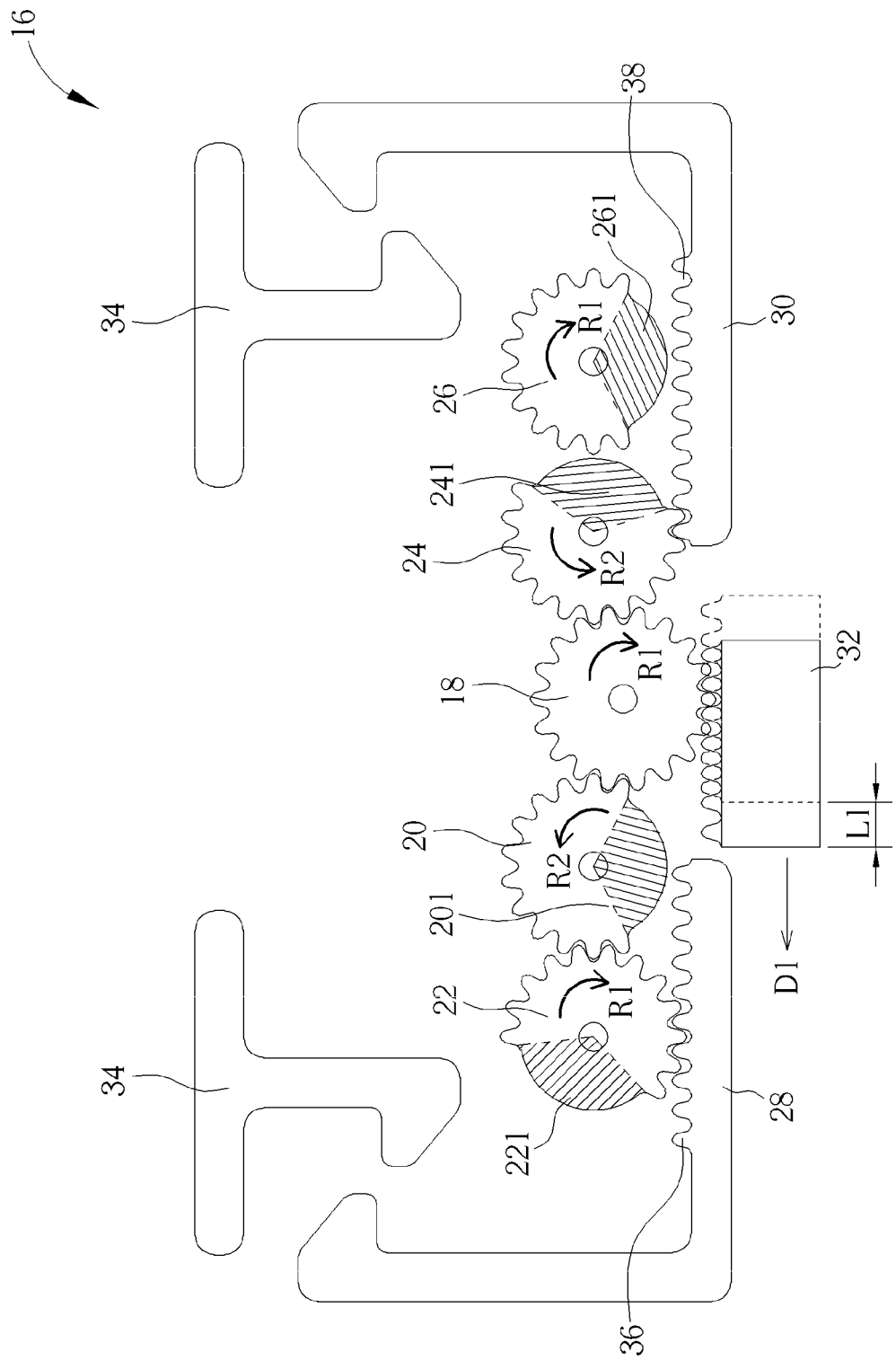
FIG. 3 and FIG. 4 respectively are diagrams of the two-way lock mechanism in different modes according to the embodiment of the present invention.
Figure 4:
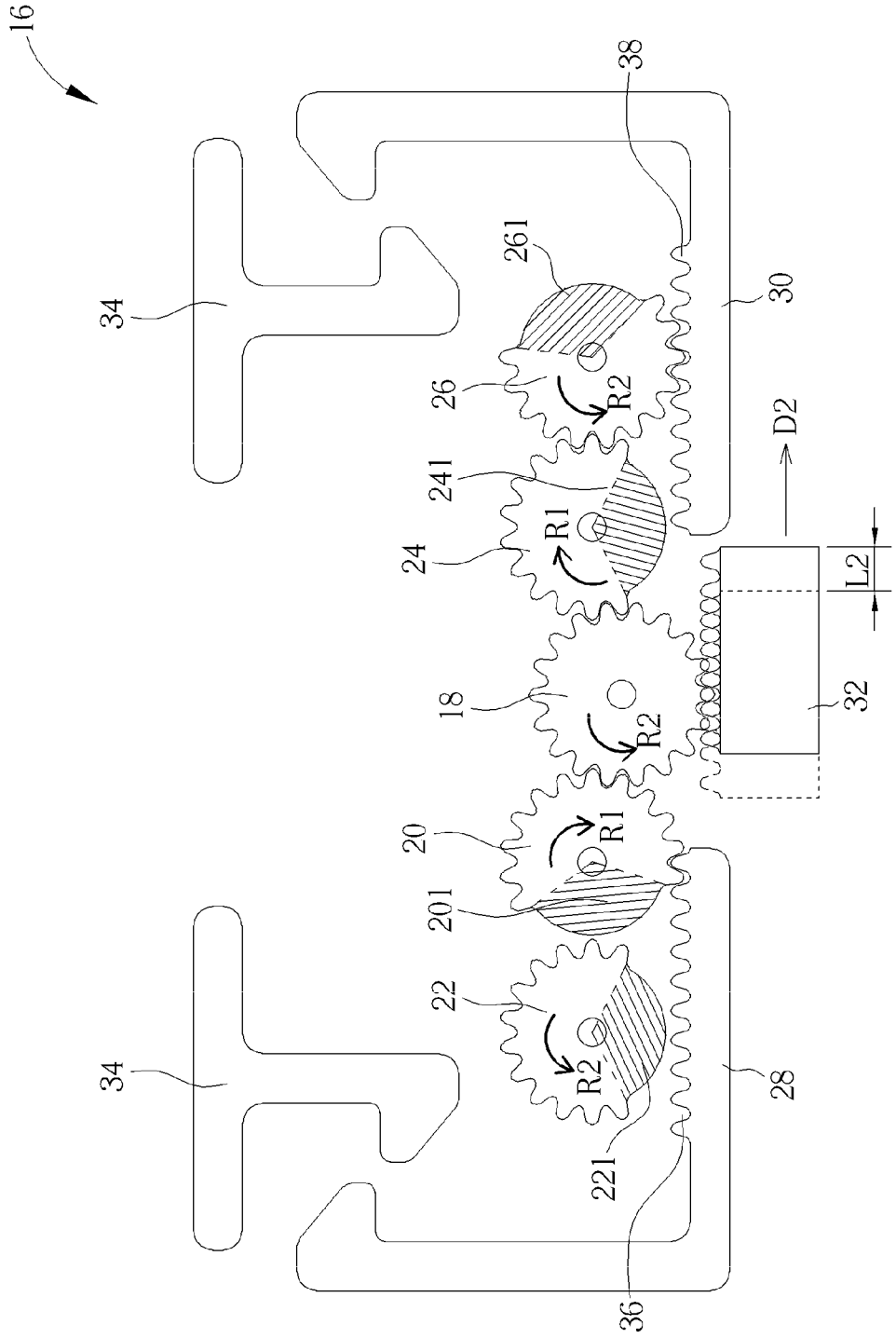

Please refer to FIG. 3 and FIG. 4. FIG. 3 and FIG. 4 respectively are diagrams of the two-way lock mechanism 16 in different modes according to the embodiment of the present invention. As shown in FIG. 3, the actuator 32 moves the first distance L1 along the first direction D1, the actuator 32 can rotate the gear 18 along a clockwise direction R1. At the time, the gear 18 rotates the first sub-gear 20 along a counterclockwise direction R2, so that the first sub-gear 20 rotates to an angle that the first area 201 faces the first rack 36. Further, the first sub-gear 20 rotates the second sub-gear 22 along the clockwise direction R1, the second area 202 moves away from the first rack 36, and the second sub-gear 22 rotates to an angle that the second sub-gear 22 is engaged with the first rack 36. Thus, the first sub-gear 20 does not drive the first rack 36 due to structural characteristic of the local gear, and the second sub-gear 22 can separate the first hook 28 from the corresponding fixing portion 34.

Besides, the gear 18 rotates the third sub-gear 24 along the counterclockwise R2, the third area 241 moves away from the second rack 38, which means that the third sub-gear 24 rotates to an angle that the third sub-gear 24 is engaged with the second rack 38, and the second hook 30 can separate from the corresponding fixing portion 34. As the third sub-gear 24 is driven by the gear 18, the third sub-gear 24 can selectively rotate the fourth sub-gear 26 along the clockwise direction R1, so that the fourth sub-gear 26 rotates to an angle that the fourth area 261 faces the second rack 38. Therefore, the third sub-gear 24 can be selectively engaged with the fourth sub-gear 26 for small rotation according to the structural characteristic of the local gear, or the third sub-gear 24 can further not rotate the fourth sub-gear 26, and the fourth sub-gear 26 is not engaged with the second rack 38 due to the structural characteristic of the local gear. Then, the third sub-gear 24 can separate the second hook 30 from the fixing portion 34.

As shown in FIG. 4, the actuator 32 moves the second distance L2 along the second direction D2, the actuator 32 rotates the gear 18 along the counterclockwise direction R2. Meanwhile, the gear 18 rotates the first sub-gear 20 along the clockwise direction R1, so that the first area 201 moves away from the first rack 36, and the first sub-gear 20 rotates to an angle that the first sub-gear 20 is engaged with the first rack 36. As rotation of the first sub-gear 20, the first sub-gear 20 rotates the second sub-gear 22 along the counterclockwise direction R2, and the second sub-gear 22 rotates to an angle that the second area 221 faces the first rack 36. Thus, the first sub-gear 20 can be selectively engaged with the second sub-gear 22 for small rotation, or the first sub-gear 20 further can be not engaged with the second sub-gear 22, so that the second sub-gear 22 does not drive the first rack 36, and the first sub-gear 20 is engaged with the first rack 36 to separate the first hook 28 from the corresponding fixing portion 34.

The gear 18 can rotate the third sub-gear 24 along the clockwise direction R1, so the third sub-gear 24 rotates to an angle that the third area 241 faces the second rack 38. The third sub-gear 24 can further rotate the fourth sub-gear 26 along the counterclockwise direction R2, the fourth area 261 moves away from the second rack 38, which means that the fourth sub-gear 26 rotates to an angle that the fourth sub-gear 26 is engaged with the second rack 38. Then, the third sub-gear 24 does not drive the second rack 38 due to the structural characteristic of the local gear, and the fourth sub-gear 26 is stably engaged with the second rack 38 to separate the second hook 30 from the fixing portion 34. As shown in FIG. 3 and FIG. 4, the two-way lock mechanism 16 of the present invention can effectively separate the first hook 28 and the second hook 30 from the corresponding fixing portions 34 for two-way unlock function, no matter what direction the actuator 32 moves.

Figure 5:
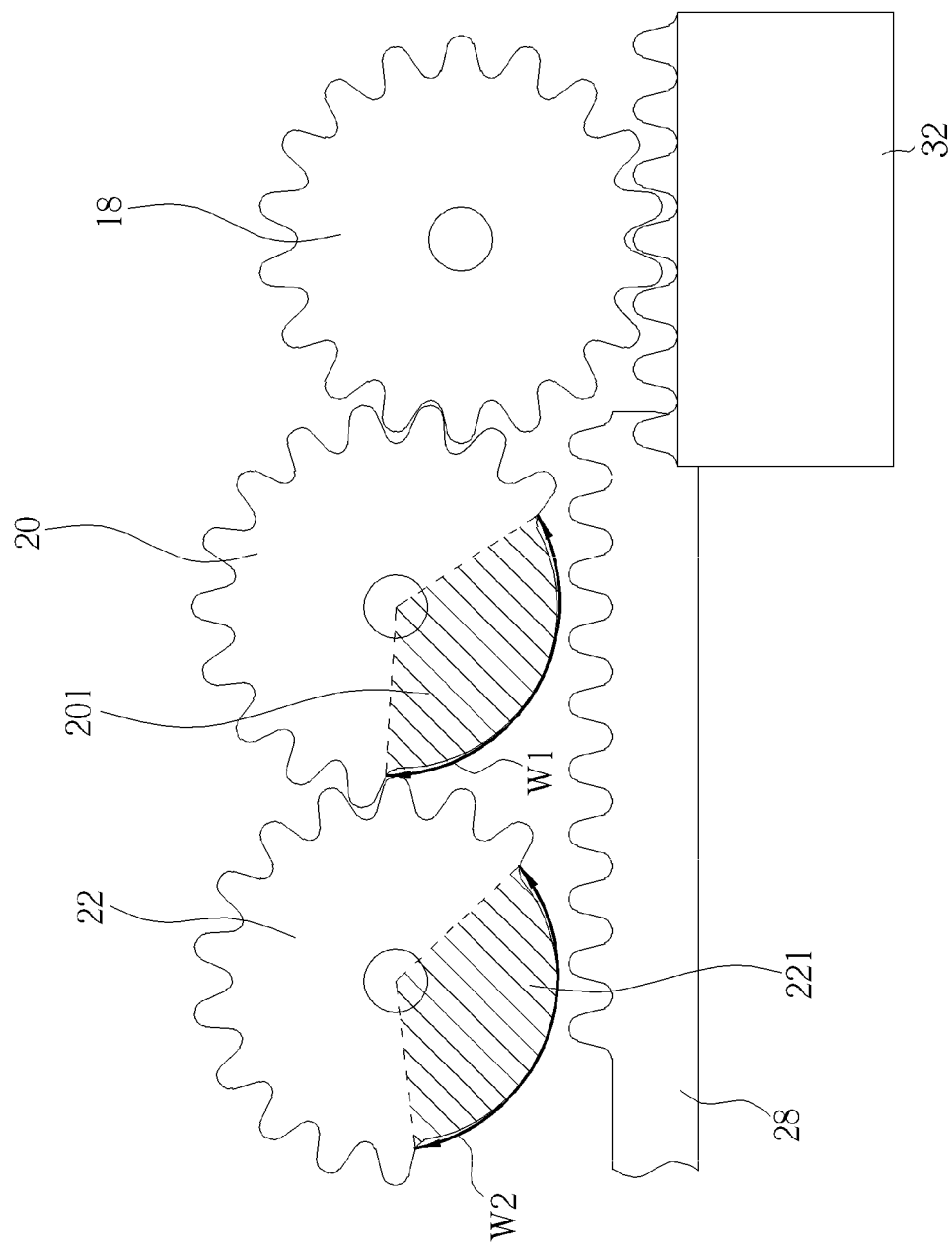
FIG. 5 is a diagram of a first sub-gear and a second sub-gear at the initial position according to the embodiment of the present invention.

Please refer to FIG. 5. FIG. 5 is a diagram of the first sub-gear 20 and the second sub-gear 22 at the initial position according to the embodiment of the present invention. An arc length W1 of the first area 201 can substantially correspond to the length of the first distance L1. The first sub-gear 20 is located at the initial position, the first area 201 faces a gap between the second sub-gear 22 and the first rack 36. As shown in FIG. 3 and FIG. 5, the first distance L1 of the actuator 32 cannot be greater than the arc length W1 of the first area 201 when the first sub-gear 20 rotates along the counterclockwise direction R2, so as to prevent the engagement between the first sub-gear 20 and the first rack 36 due to over-rotation, and to prevent lock of the first hook 28 by the first sub-gear 20. As shown in FIG. 4 and FIG. 5, a right side of the first area 201 can be adjacent to the first rack 36. When the first sub-gear 20 rotates along the clockwise direction R1, the first sub-gear 20 can be immediately engaged with the first rack 36 to separate the first hook 28 from the fixing portion 34.

An arc length W2 of the second area 221 can substantially correspond to the length of the second distance L2. The second area 221 can face the first rack 36 when the second sub-gear 22 is located at the initial position. As shown in FIG. 3 and FIG. 5, a right side of the second area 221 can be adjacent to the first rack 36, so that the second sub-gear 22 can be immediately engaged with the first rack 36 when the second sub-gear 22 rotates along the clockwise direction R1, and the second sub-gear 22 can separate the first hook 28 from the fixing portion 34. As shown in FIG. 4 and FIG. 5, the second distance L2 of the actuator 32 cannot be greater than the arc length W2 of the second area 221, so as to prevent an engagement between the second sub-gear 22 and the first rack 36 when the second sub-gear 22 rotates along the counterclockwise direction R2, and to prevent lock of the first hook 28 by the second sub-gear 22.

Furthermore, arc lengths of the third area 241 and the fourth area 261 can respectively correspond to the second distance L2 and the first distance L1. The third sub-gear 24 is located at the initial position, the third area 241 can face a gap between the fourth sub-gear 26 and the second rack 38. The fourth sub-gear 26 is located at the initial position, the fourth area 261 can face the second rack 38. Disposition between the third sub-gear 24, the fourth sub-gear 26 and the second rack 38 is shown in FIG. 3 to FIG. 5, which equals disposition between the first sub-gear 20, the second sub-gear 22 and the first rack 36, and detailed description is omitted herein for simplicity.

Comparing to the prior art, the two-way lock mechanism of the present invention utilizes a structural combination of the normal gear and the local gears to simultaneously separate the first hook and the second hook from the fixing portions when the actuator moves to the left or to the right. The two-way lock mechanism of the present invention suitable for the right-handed habit and the left-handed habit has advantages of simple structure and low manufacturing cost, and can effectively increase operational convenience and market competition of the product.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A two-way lock mechanism comprising:
a gear;
a first sub-gear having an area without a rack structure and engaged with the gear;
a second sub-gear having an area without a rack structure for being engaged with the first sub-gear, the second sub-gear being rotated by the first sub-gear;
a third sub-gear having an area without a rack structure and engaged with the gear;
a fourth sub-gear having an area without a rack structure for being engaged with the third sub-gear, the fourth sub-gear being rotated by the third sub-gear;
a first hook buckling a fixing portion, the first hook comprising a first rack disposed by sides of the first sub-gear and the second sub-gear;
a second hook buckling another fixing portion, the second hook comprising a second rack disposed by sides of the third sub-gear and the fourth sub-gear; and
an actuator disposed by the gear, the actuator moving a first distance along a first direction to simultaneously rotate the gear, so as to respectively rotate the second sub-gear and the third sub-gear relative to the first rack and the second rack, and to separate the first hook and the second hook from the fixing portions, the actuator further moving a second distance along a second direction opposite to the first direction to simultaneously rotate the gear, so as to respectively rotate the first sub-gear and the fourth sub-gear relative to the first rack and the second rack, and to separate the first hook and the second hook from the fixing portions;
wherein the first sub-gear and the second sub-gear are not simultaneously engaged with the first rack, the third sub-gear and the fourth sub-gear are not simultaneously engaged with the second rack when the gear is located at an initial position.

2. The two-way lock mechanism of claim 1, wherein the first sub-gear is engaged with the gear and the second sub-gear and is not engaged with the first rack, the second sub-gear is engaged with the first rack, the third sub-gear is engaged with the gear and the second rack and is selectively engaged with the fourth sub-gear, and the fourth sub-gear is not engaged with the second rack when the actuator moves along the first direction.

3. The two-way lock mechanism of claim 1, wherein the first sub-gear is engaged with the gear and the first rack and is selectively engaged with the second sub-gear, the second sub-gear is not engaged with the first rack, the third sub-gear is engaged with the gear and the fourth sub-gear and is not engaged with the second rack, and the fourth sub-gear is engaged with the second rack when the actuator moves along the second direction.

4. The two-way lock mechanism of claim 1, further comprising:
at least one resilient component disposed on a side of the actuator, the resilient component driving the actuator back to the initial position.

5. The two-way lock mechanism of claim 1, wherein a first area of the first sub-gear, a second area of the second sub-gear, a third area of the third sub-gear and a fourth area of the fourth sub-gear do not have rack structure, areas of the sub-gears face the first rack and the second rack when the gear is located at the initial position.

6. The two-way lock mechanism of claim 5, wherein arc lengths of the first area and the fourth length respectively correspond to the first distance, and arc lengths of the second area and the third area respectively correspond to the second distance.

7. The two-way lock mechanism of claim 5, wherein the first area faces a gap between the second sub-gear and the first rack when the first sub-gear is located at the initial position.

8. The two-way lock mechanism of claim 7, wherein the second area faces the first rack when the second sub-gear is located at the initial position.

9. The two-way lock mechanism of claim 5, wherein the third area faces a gap between the fourth sub-gear and the second rack when the third sub-gear is located at the initial position.

10. The two-way lock mechanism of claim 9, wherein the fourth area faces the second rack when the fourth sub-gear is located at the initial position.

11. An electronic device comprising:
a first casing, the first casing comprising at least two fixing portions;
a second casing disposed on the first casing in a foldable manner; and
a two-way lock mechanism disposed between the first casing and the second casing to lock on the fixing portions for constraint of the first casing and the second casing, the two-way lock mechanism comprising:
a gear;
a first sub-gear having an area without a rack structure and engaged with the gear;
a second sub-gear having an area without a rack structure for being engaged with the first sub-gear, the second sub-gear being rotated by the first sub-gear;
a third sub-gear having an area without a rack structure and engaged with the gear;
a fourth sub-gear having an area without a rack structure for being engaged with the third sub-gear, the fourth sub-gear being rotated by the third sub-gear;
a first hook buckling one of the fixing portions, the first hook comprising a first rack disposed by sides of the first sub-gear and the second sub-gear;
a second hook buckling the other of the fixing portions, the second hook comprising a second rack disposed by sides of the third sub-gear and the fourth sub-gear; and
an actuator disposed by the gear, the actuator moving a first distance along a first direction to simultaneously rotate the gear, so as to respectively rotate the second sub-gear and the third sub-gear relative to the first rack and the second rack, and to separate the first hook and the second hook from the fixing portions, the actuator further moving a second distance along a second direction opposite to the first direction to simultaneously rotate the gear, so as to respectively rotate the first sub-gear and the fourth sub-gear relative to the first rack and the second rack, and to separate the first hook and the second hook from the fixing portions;
wherein the first sub-gear and the second sub-gear are not simultaneously engaged with the first rack, the third sub-gear and the fourth sub-gear are not simultaneously engaged with the second rack when the gear is located at an initial position.

12. The electronic device of claim 11, wherein the first sub-gear is engaged with the gear and the second sub-gear and is not engaged with the first rack, the second sub-gear is engaged with the first rack, the third sub-gear is engaged with the gear and the second rack and is selectively engaged with the fourth sub-gear, and the fourth sub-gear is not engaged with the second rack when the actuator moves along the first direction.

13. The electronic device of claim 11, wherein the first sub-gear is engaged with the gear and the first rack and is selectively engaged with the second sub-gear, the second sub-gear is not engaged with the first rack, the third sub-gear is engaged with the gear and the fourth sub-gear and is not engaged with the second rack, and the fourth sub-gear is engaged with the second rack when the actuator moves along the second direction.

14. The electronic device of claim 11, wherein the two-way lock mechanism further comprises:
at least one resilient component disposed on a side of the actuator, the resilient component driving the actuator back to the initial position.

15. The electronic device of claim 11, wherein a first area of the first sub-gear, a second area of the second sub-gear, a third area of the third sub-gear and a fourth area of the fourth sub-gear do not have rack structure, areas of the sub-gears face the first rack and the second rack when the gear is located at the initial position.

16. The electronic device of claim 15, wherein arc lengths of the first area and the fourth length respectively correspond to the first distance, and arc lengths of the second area and the third area respectively correspond to the second distance.

17. The electronic device of claim 15, wherein the first area faces a gap between the second sub-gear and the first rack when the first sub-gear is located at the initial position.

18. The electronic device of claim 17, wherein the second area faces the first rack when the second sub-gear is located at the initial position.

19. The electronic device of claim 15, wherein the third area faces a gap between the fourth sub-gear and the second rack when the third sub-gear is located at the initial position.

20. The electronic device of claim 19, wherein the fourth area faces the second rack when the fourth sub-gear is located at the initial position.

* * * * *